United States Patent
Tam et al.

(10) Patent No.: US 7,042,262 B2
(45) Date of Patent: May 9, 2006

(54) SYSTEM AND METHOD FOR PROVIDING A FAST AND POWER EFFICIENT JAM LATCH

(75) Inventors: Honkai Tam, Redwood City, CA (US); Pranjal Srivastava, Los Gatos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/698,892

(22) Filed: Oct. 31, 2003

(65) Prior Publication Data

US 2005/0093603 A1 May 5, 2005

(51) Int. Cl.
*H03K 3/037* (2006.01)
(52) U.S. Cl. .................. 327/199; 327/215; 327/217
(58) Field of Classification Search ........... 327/198, 327/199, 200, 203, 211, 212, 218
See application file for complete search history.

(56) References Cited

U.S. PATENT DOCUMENTS

| | | | | |
|---|---|---|---|---|
| 5,424,995 A | * | 6/1995 | Miyazaki et al. | 365/230.05 |
| 5,732,036 A | * | 3/1998 | Merritt et al. | 365/203 |
| 5,952,859 A | * | 9/1999 | Kim et al. | 327/200 |
| 6,320,441 B1 | * | 11/2001 | Fletcher et al. | 327/211 |

* cited by examiner

*Primary Examiner*—Tuan T. Lam
*Assistant Examiner*—Hiep Nguyen
(74) *Attorney, Agent, or Firm*—Martine Penilla & Gencarella LLP

(57) ABSTRACT

A system and method of resetting a jam latch circuit includes an activation device. The activation device having respective inputs coupled to each one of several data lines. A first reset device is also included and has a first control input coupled to an output of the activation device. The first reset device having a reset voltage source coupled to an input of the first reset device. A second reset device is also included and has a second control input coupled a control signal. The second reset device being coupled in series with the first reset device. A storage cell is coupled to an output of the second reset device.

17 Claims, 6 Drawing Sheets

SYSTEM AND METHOD FOR PROVIDING A FAST AND POWER EFFICIENT JAM LATCH

BACKGROUND OF THE INVENTION

1. Field of the Invention

The present invention relates generally to data transmission networks, and more particularly, to methods and systems for latching received data for subsequent use.

2. Description of the Related Art

A jam latch is a circuit that is typically used to capture data being output from a previous circuit or device in a data system. The jam latch temporarily holds the data so that a subsequent device or circuit can read the data. In this manner the data can be accurately captured so that the subsequent stage can use the correct data level. The jam latch circuit can also increase the power of (i.e., amplify) the data signal. By way of example a jam latch can be used to capture data on a data bus for a device coupled to the data bus, amplify the captured data and then output the captured data to the coupled device.

FIG. 1 is an exemplary prior art jam latch circuit 100. A cross-coupled latching inverter pair X1, X2 latches high whenever either of the DATA IN 1 or DATA IN 2 signals go low. By way of example, when DATA IN 1 switches to a low state voltage, transistor M3 begins to conduct which applies a high state voltage to DD_SIN. DD_SIN in the high state causes the inverter pair X1, X2 to latch in a high state and maintain a high signal level applied to DD_SIN even after M3 stops applying the high state voltage to the DATA IN 1 (i.e., when M3 stops conducting). Similarly, when DATA IN 2 goes low, transistor M0 conducts a high state to DD_SIN, which can also cause inverter pair X1, X2 to latch in a high state.

When DD_SIN is high, inverter X0 inverts DD_SIN to output a low state SIN_1 signal. The SIN_1 signal is applied to input 102A of nand gate X3. As long as at least one of inputs 102A, 102B, 102C is low on nand gate X3, then DD_OUT will be a high state. The low SIN_1 is output from inverter X0 a time delay referred to as a "one gate delay" from when the DD_SIN goes high. The one gate delay is caused by the time required for the inverter X0 to switch from one state to the other (i.e., from high state to low state).

The inverter pair X1, X2 remains latched high (and therefore DATA OUT high) until all of the reset transistors M1, M5, M7 conduct at the same time. When all the reset transistors M1, M5, M7 conduct, a low signal level (i.e. ground potential) is applied to the inverter pair X1, X2 (i.e., the high state voltage of the inverter pair is pulled down to a low potential). Thus the inverter pair X1, X2 is reset to a low state. As shown, reset transistor M5 will conduct when DATA IN 1 is high, reset transistor M1 will conduct when DATA IN 2 is high, and reset transistor M7 will conduct when the clock signal (CLK) goes high. One or more additional reset transistors (not shown) can also be included in series with the reset transistors M1, M5, M7 such as to allow an additional reset condition control (e.g., an enable control). Resetting the inverter pair X1, X2 is a "three gate delay" as the resulting data output will not change until the inverter pair X1, X2, the inverter X0 and the nand gate X3 switch states.

When the inverter pair X1, X2 is reset to a low state, a low state is applied to the DD_SIN. The inverter X0 inverts the low DD_SIN to output a high SIN_1. A high applied to each of the nand gate X3 inputs 102A, 102B, 102C causes the DATA OUT to be low.

Both the input and the output of keeper circuit K1 are coupled to DATA IN 1. Keeper circuit K1 includes an inverter XK1 that has an input coupled to the DATA IN 1 and an output coupled to the base terminal of a transistor MK1. The transistor MK1 has an input coupled to a high state potential and an output coupled to the DATA IN 1. When the DATA IN 1 goes high, the XK1 outputs a low potential that will enable transistor MK1 thereby causing transistor MK1 to conduct the high state potential to DATA IN 1. Keeper circuits K1, K2 support the dynamic logic level on the respective data lines DATA IN 1 and DATA IN 2, so that the logic level does not leak down (or up) to an incorrect or ambiguous logic level.

As described above, the jam latch 100 captures when the data level goes low on either of the DATA IN 1 and DATA IN 2 data lines and, one gate delay later, outputs a high signal level from the nand gate X3. The jam latch 100 can also amplify the data signal level so that the signal levels on DATA IN 1 and DATA IN 2 can be very low (e.g., 0.0 v=low state and 0.3 v=high state) and DATA OUT have much higher signal voltages (e.g., 1.0 v=low state and 5.0 v=high state) and power levels so that subsequent devices can be driven by the DATA OUT output voltage and current.

The prior art jam latch circuit 100 has several shortfalls that limit, for example the scalability of the jam latch circuit. The short falls include excessive internal loads and excessive switch time (i.e., switch speed too slow). The excessive internal loads require larger circuit elements (i.e., device size) therefore uses more power and geography on the semiconductor die. By way of example, DATA IN 1 is connected to three devices: keeper K1 and transistors M3 and M5. Each of the three devices K1, M3 and M5 form a parasitic load on the DATA IN 1 data line. As a result, this parasitic load can increase the switching time of the DATA IN 1 data line as these parasitic loads must also be charged or discharged as the state of the DATA IN 1 data line changes. This parasitic load can be a greater proportion of the total load as the gain of the jam latch 100 is reduced. By way of example, in a jam latch having a gain of 16 (i.e., 16 times power amplification), the total load is substantially greater than in a similar jam latch having a gain of 4, while the parasitic load caused by keeper K1 and transistors M3 and M5 remain constant in either of the jam latches.

Further, each of the series reset transistors M1, M5 and M7 are sized the same so that they switch substantially identically. The series reset transistors M1, M5 and M7 must also be sized to sink the current conducted across the series reset transistors. In the typical two data line jam latch 100, series reset transistors M1, M5 and M7 have a device size of 5.76 micron. In a similarly designed three data line jam latch, the corresponding series rest transistors M1, M5 and M7 and an additional transistor (i.e., for the third data line) would have a device size of 7.2 micron so as to be able to handle the increased current demands caused by the additional series transistor. In yet another similarly designed four data line jam latch circuit, the series reset transistors would be even larger. As a result, the design of the jam latch 100 cannot be efficiently scaled to include more than two or possibly three data lines. As the device sizes of the series rest transistors M1 and M5 increases their corresponding parasitic loads of the corresponding data lines (i.e., DATA IN 2, DATA IN 1, respectively) are also increased, further degrading the switching performance of the data lines.

In addition, as the device size of the series reset transistors increase, the space required for the larger devices increase and can therefore consume excessive area of the semiconductor die. Further, the increased current load of the larger device sizes increases the overall current load and the resulting heat dissipation required for the jam latch circuit. The increased heat load can further complicate the design and placement of the jam latch components. Larger devices typically also have slower switching times at the same current level or require additional current to cause the switching time to remain approximately comparable to a similar smaller device. In view of the foregoing, there is a need for a scalable, power efficient jam latch circuit.

SUMMARY OF THE INVENTION

Broadly speaking, the present invention fills these needs by providing an improved, more efficient jam latch. It should be appreciated that the present invention can be implemented in numerous ways, including as a process, an apparatus, a system, computer readable media, or a device. Several inventive embodiments of the present invention are described below.

One embodiment provides a jam latch circuit reset circuit. The jam latch circuit reset circuit includes an activation device. The activation device having respective inputs coupled to each one of several data lines. A first reset device is also included and has a first control input coupled to an output of the activation device. The first reset device having a reset voltage source coupled to an input of the first reset device. A second reset device is also included and has a second control input coupled a control signal. The second reset device being coupled in series with the first reset device. A storage cell is coupled to an output of the second reset device.

An output of the storage cell can be coupled to the output of the second reset device. The control signal can be a timing signal. The activation device can be a logic device such as an and gate, or a nand gate, xor gate or other suitable logic device.

A voltage source can also be coupled to the output of the storage cell through a voltage source controller. The voltage source controller can include a control input coupled to the output of the activation device.

Each of the voltage source controller, the first reset device, and the second reset device can include transistors. The plurality of data lines can include two or more data lines. The storage cell can include a storage cell input and a storage cell output, the storage cell input being opposite the storage cell output. The output of the second reset device being coupled to the storage cell output, and an input circuit being coupled to the storage cell input.

Another embodiment provides a method of capturing data in a jam latch circuit. The method including receiving a respective data signal on at least one of several data lines. A storage cell is charged on storage cell input. A data signal from a storage cell output. The respective data signal from each of the data lines and the data signal output from the storage cell output are combined and a jam latch output data signal is output. The jam latch circuit can be reset by combining the respective data signal from each of the data lines to activate a first reset device. A second reset device is activated by a control signal and a reset voltage is applied to the storage cell.

Combining the respective data signal from each of the data lines to activate the first reset device can include coupling the respective data signal from each of the data lines to an activation device and outputting an activation signal, from the activation device to the first reset device, when a level of the respective data signal from each of the data lines is substantially equal.

Yet another embodiment provides a method of resetting a jam latch. The method including combining a respective data signal from each of multiple data lines to activate a first reset device, activating a second reset device with a control signal, and applying a reset voltage to a storage cell.

Combining the respective data signal from each of the multiple data lines (e.g. two or more data lines) to activate the first reset device can include coupling the respective data signal from each of the data lines to an activation device and outputting an activation signal, from the activation device to the first reset device, when a level of the respective data signal from each of the plurality of data lines is substantially equal.

The control signal can include a clock signal. The control signal can be inverted. The method can also include disconnecting a voltage source from the storage cell. The voltage source is disconnected from the storage cell substantially simultaneously with activating the first reset device.

The method can also include coupling a reset voltage across the activated first reset device and across the activated second reset device to apply the reset voltage to the storage cell.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for an improved jam latch circuit will now be described. It will be apparent to those skilled in the art that the present invention may be practiced without some or all of the specific details set forth herein.

Jam latches are used extensively in digital circuits to detect, capture and amplify data signal levels for use in a subsequent circuit. Jam latches thereby increase the accuracy of the data being provided to the subsequent circuit. An efficient jam latch circuit should include efficiency of power consumption, geographical consumption (i.e., small device size) and fast switching speed for use in higher frequency (i.e., faster switching) systems.

Figure 1:
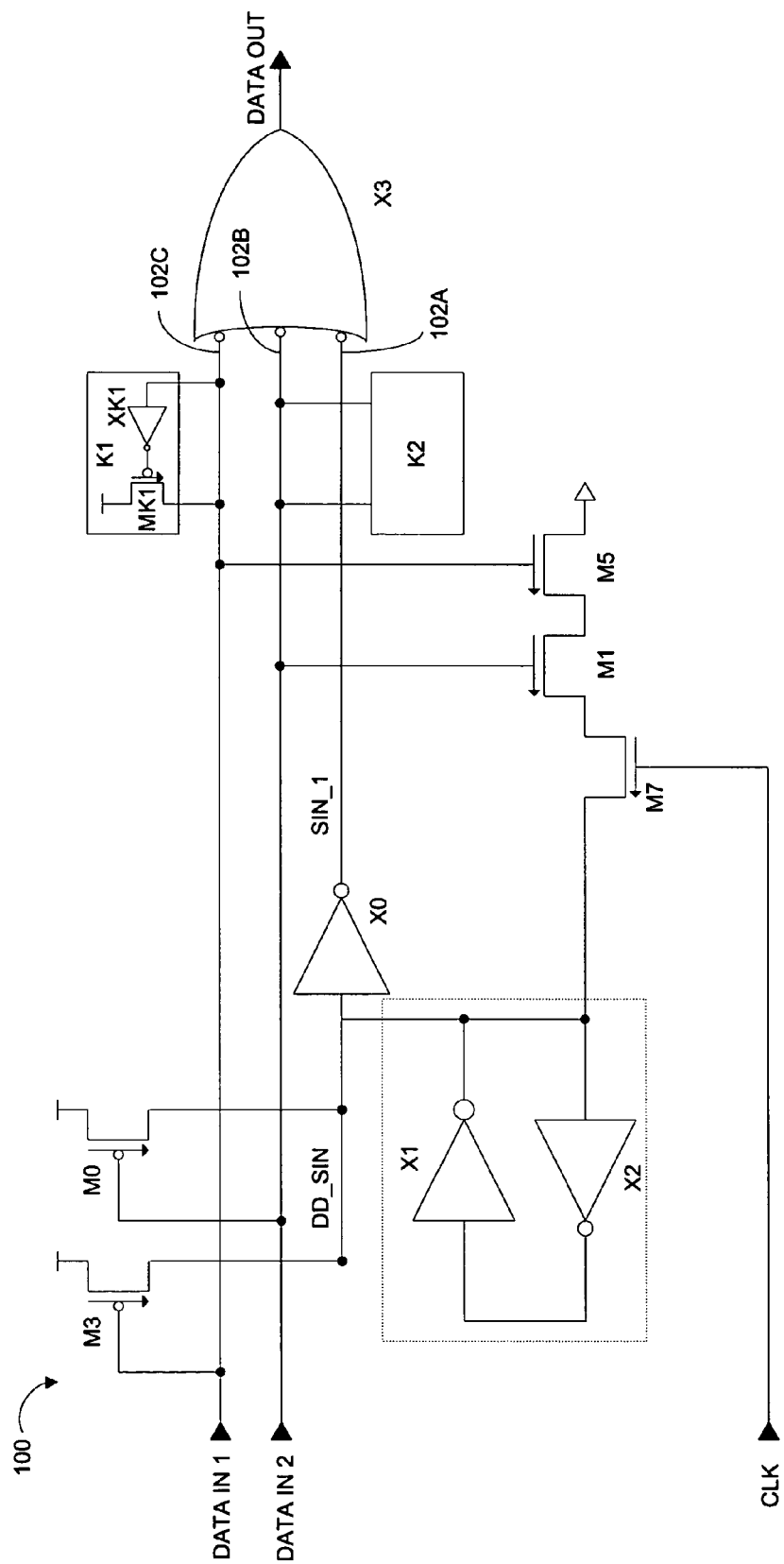
FIG. 1 is an exemplary prior art jam latch circuit.
Figure 2:
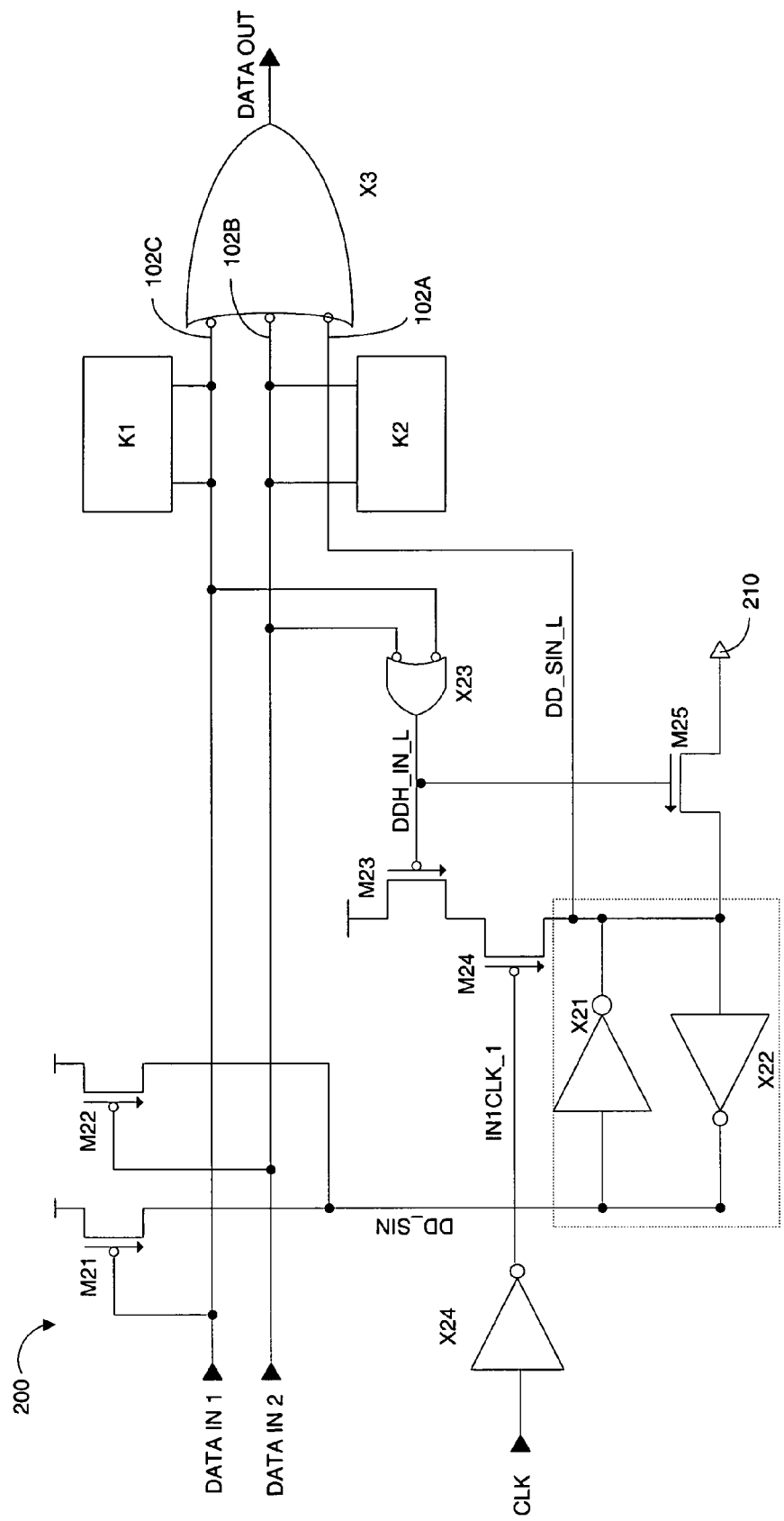
FIG. 2 is a block diagram of a two data line jam latch circuit, in accordance with one embodiment of the present invention.

FIG. 2 is a block diagram of a two data line jam latch circuit 200, in accordance with one embodiment of the present invention. The charging of a cross-coupled inverter pair X21, X22, is accomplished through MOS transistors M21, M22. Discharging or resetting of the inverter pair X21, X22 is also unique as will be described in more detail below. Charging the inverter pair X21, X22 begins when transistors M21 and M22 begin conducting when the respective DATA IN 1 and DATA IN 2 go low. When either of transistors M21 and M22 are conducting a high is applied to DD_SIN. DD_SIN is coupled to an input side of the inverter pair X21, X22. A high on DD_SIN applies a high to the inverter pair X21, X22 charging the input side of the inverter pair to a high state. When the inverter pair X21, X22 are charged in a high state by DD_SIN, an output signal DD_SIN_L goes low because the output signal is taken from the opposite side of the cross coupled inverter pair X21, X22, thereby eliminating the need for inverting the output signal (and the associated inverter X0) from the cross coupled inverter pair such as described in FIG. 1 above. The output signal DD_SIN_L is coupled to input 102A of output nand gate X3.

A one-gate delay (output nand gate X3) transpires between when DATA IN 1 goes low to when the DATA OUT can switch due to the arrival of the corresponding low applied by the DATA IN 1 causing the output of the nand gate X3 to go high. This one-gate delay is substantially the same as the three-gate delay that occurs in the prior art jam latch circuit 100 described in FIG. 1 above and therefore the timing is substantially similar.

The reset process of the inverter pair X21, X22 is significantly different than the reset process for the prior art jam latch circuit 100 described in FIG. 1 above. A nand gate X23 has inputs coupled to each of the DATA IN 1 and DATA IN 2 rather than having larger, individual transistors M1, and M5, as shown in FIG. 1 above. The device sizes and corresponding parasitic loads of the nand gate X23 inputs can be much smaller than prior art transistors M1 and M5. As a result, the loading problems caused by transistors M1 and M5 can be substantially reduced and the performance of the jam latch is therefore improved. Because the parasitic loads are reduced on each of the DATA IN 1 and DAT IN 2, the switching frequency is increased (i.e., reduces switching time). The reduced load also reduces the power dissipation requirements of the jam latch 200 thereby providing a more power efficient performance. The reduced device sizes of the nand gate X23 also reduces the space required on the semiconductor die, thereby allowing a more efficient use of the valuable real estate of the semiconductor die.

Two series reset transistors M23, M24 are coupled to the output side of the cross-coupled inverter pair X21, X22. The cross-coupled inverter pair X21, X22 are reset when a high state voltage is applied to the output by series reset transistors M23, M24. When the output DDH_IN_L of the nand gate X23 goes low, transistor M23 conducts a high state voltage to transistor M24. Transistor M24 conducts one gate delay after the clock signal CLK goes high at the input of inverter X24. The output of inverter X24 goes low which enables transistor M24. When both transistor M23 and transistor M24 are conducting, then the cross-coupled inverter pair X21, X22 are reset and the output DD_SIN_L goes high. The cross-coupled inverter pair X21, X22 are reset after a three-gate delay (inverter X24, transistor M24 and inverter pair X21, X22) similar to the reset delay described in FIG. 1 above.

Transistor M24 must turn off from a previous cycle, before transistor M23 begins conducting in a current cycle. To ensure this timing, in one embodiment, transistor M23 has an about 10% slower switching time so that transistor M24 can be disabled by signal IN1CLK_1 going high before transistor M23 begins conducting.

Transistor M25 is also coupled between a low state voltage (e.g., a ground potential) 210 and the output side of the cross-coupled inverter pair X21, X22. Transistor M25 conducts whenever the output signal DDH_IN_L from nand gate X23 is high (i.e., one gate delay after any one or both of the DATA IN 1 or DATA IN 2 go low). Transistor M25 functions as a pull down transistor to assist transistors M21 and M22 in charging the cross-coupled inverter pair X21, X22. During the charging phase, transistor M25 discharges the reset high state applied to the output of the cross-coupled inverter pair X21, X22, during the reset by transistors M23 and M24. Transistor M25 will turn off substantially the same time as transistor M23 is enabled as both transistors are activated by opposite states of the signal DDH_IN_L output from the nand gate X23.

Figure 3:
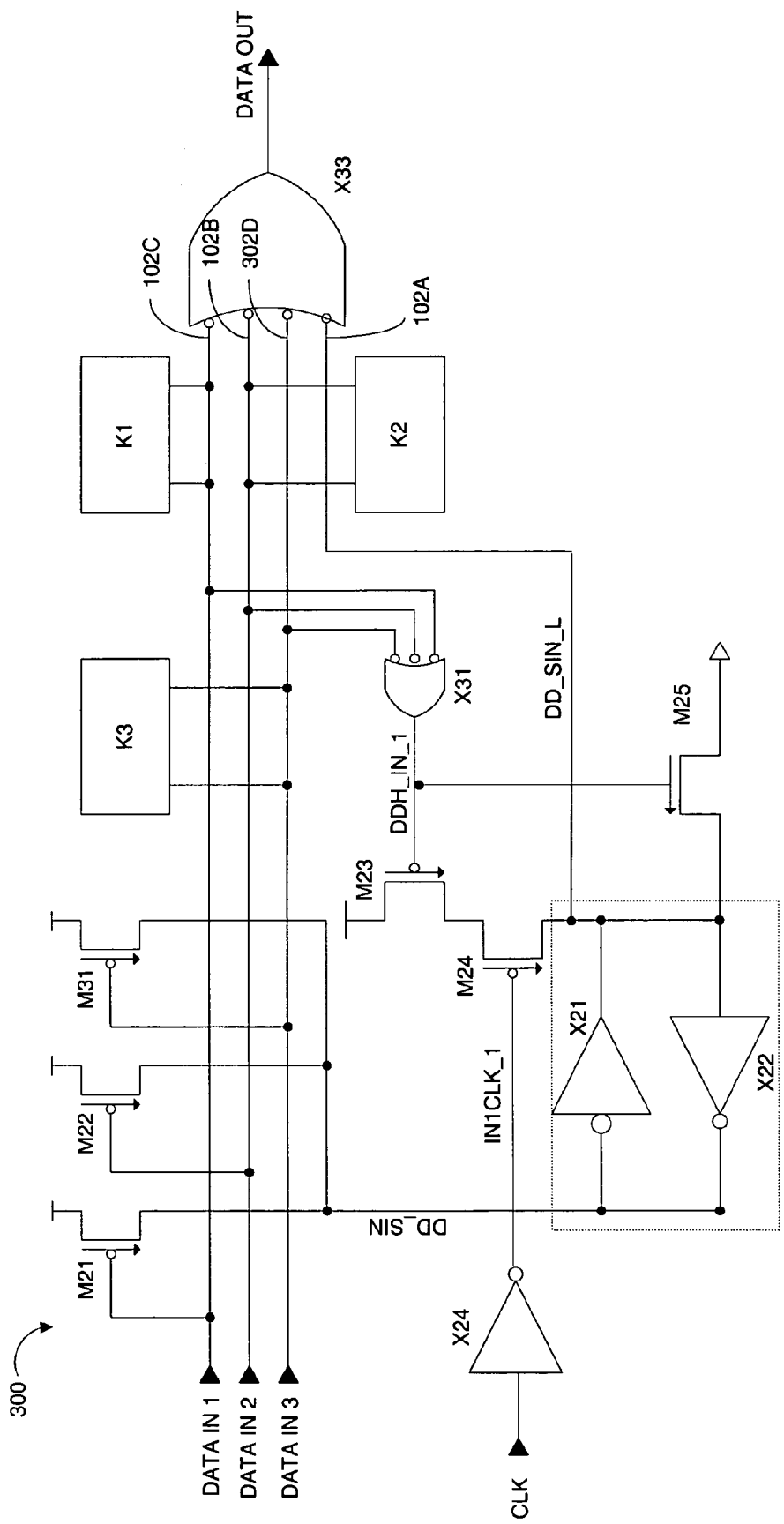
FIG. 3 is a block diagram of a three data line jam latch circuit, in accordance with one embodiment of the present invention.

FIG. 3 is a block diagram of a three data line jam latch circuit 300, in accordance with one embodiment of the present invention. The three data line jam latch circuit 300 is very similar to the two data line jam switch circuit 200 shown in FIG. 2 above. The three data line jam latch circuit 300 includes a third data line DATA IN 3 and corresponding input transistor M31, keeper circuit K3, input 302D to output nand gate X33, and third input to nand gate X31. As described above, the nand gate X31 provides a low parasitic load input to the reset circuit that includes nand gate X23, transistors M23, M24, M25 and inverter X22. The reset circuit provides a minimal load to the data lines DATA IN 1, DATA IN 2 and DATA 1N 3.

As shown by a comparison of the two data line jam latch circuit 200 and the three data line jam latch circuit 300, additional data lines can be easily added with minimal changes to the overall circuit design. Also important to note is that the corresponding data delay, current load and resultant thermal load, and device sizes all remain substantially constant as the number of data lines increases. This will allow the reset circuitry to be easily scaled up to any desired number of data lines (e.g., 4, 5 . . . 8 or more data lines).

Figure 4A:
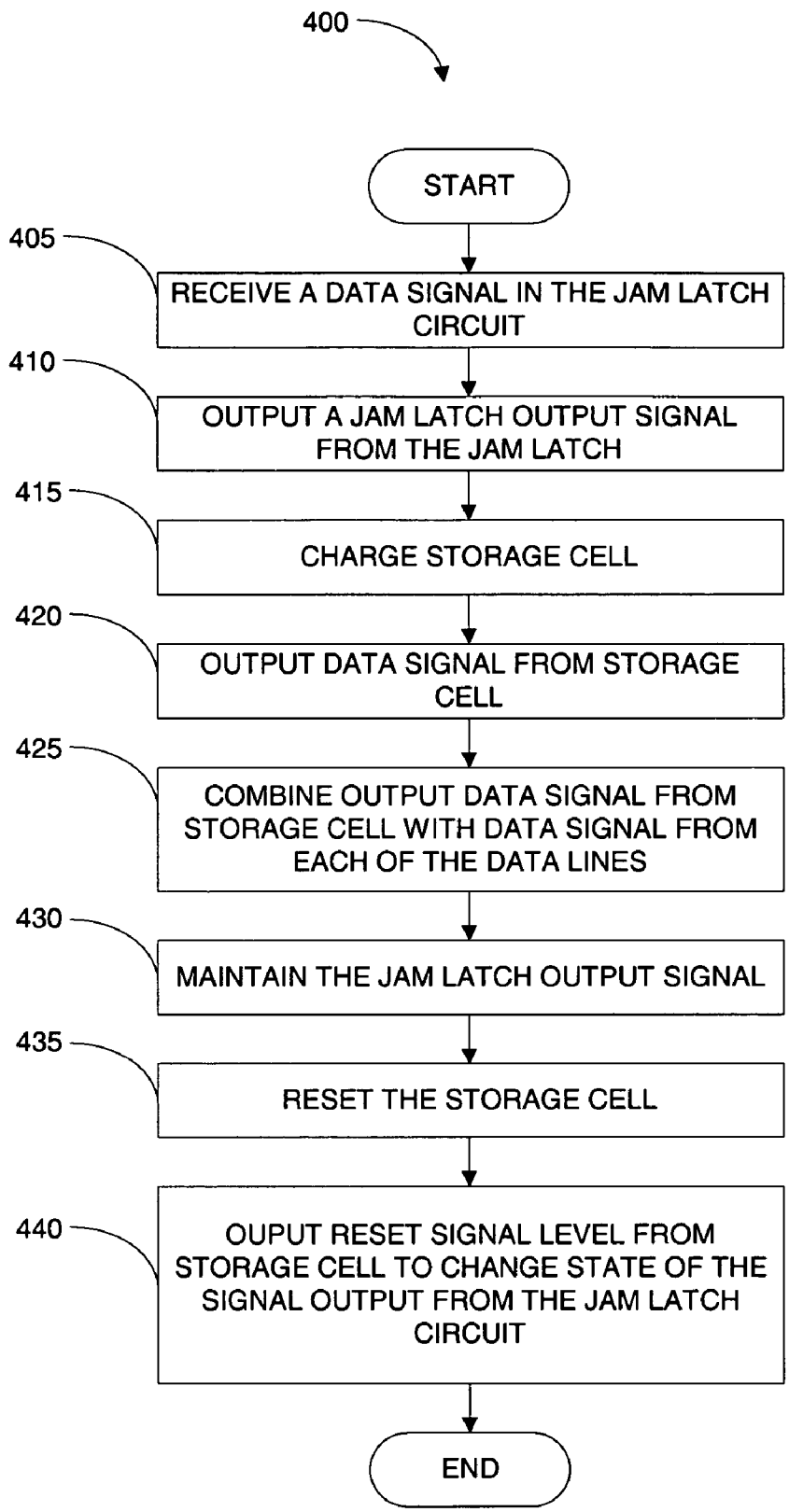
FIG. 4A is a flowchart diagram that illustrates the method operations performed by a jam latch circuit, in accordance with one embodiment of the present invention.

FIG. 4A is a flowchart diagram 400 that illustrates the method operations performed by a jam latch circuit, in accordance with one embodiment of the present invention. In an operation 405, a data signal is received. The data signal can be received on any one of several data lines that are included in the jam latch circuit.

In an operation 410, the jam latch output signal is switched to the corresponding state. The jam latch output signal can be produced in a nand gate, an and gate, an xor gate or other suitable logic device.

In an operation 415, a storage cell is charged. The storage cell can be any suitable type of storage cell such as the cross-coupled inverter pair X21, X22 shown in FIG. 2 above. The storage cell can be charged from either an input side or an output side of the storage cell. A pull up circuit can also be used to assist in charging the storage cell.

In an operation 420, a corresponding data signal is output from the storage cell. The data signal can be output from the input side or from an output side that is opposite from the input side of the storage cell.

In an operation 425, the corresponding data signal is combined with a respective data signal from each of the data lines to support and maintain the jam latch output signal in operation 430. At this point the data signal output from the storage cell can determine the jam latch output signal and the corresponding data signals on each of the several data lines can vary. In this manner the desired logic level can be accurately captured in the storage cell and the jam latch output signal be maintained independent of the subsequent signal levels on the data lines.

In an operation 435, the storage cell is reset through a reset circuit. The reset circuit can included a reset nand gate that has an input coupled to each of the data lines. In an operation 440, the reset signal level is output from the storage cell causing the output data signal to change state and the method operations end.

Figure 4B:
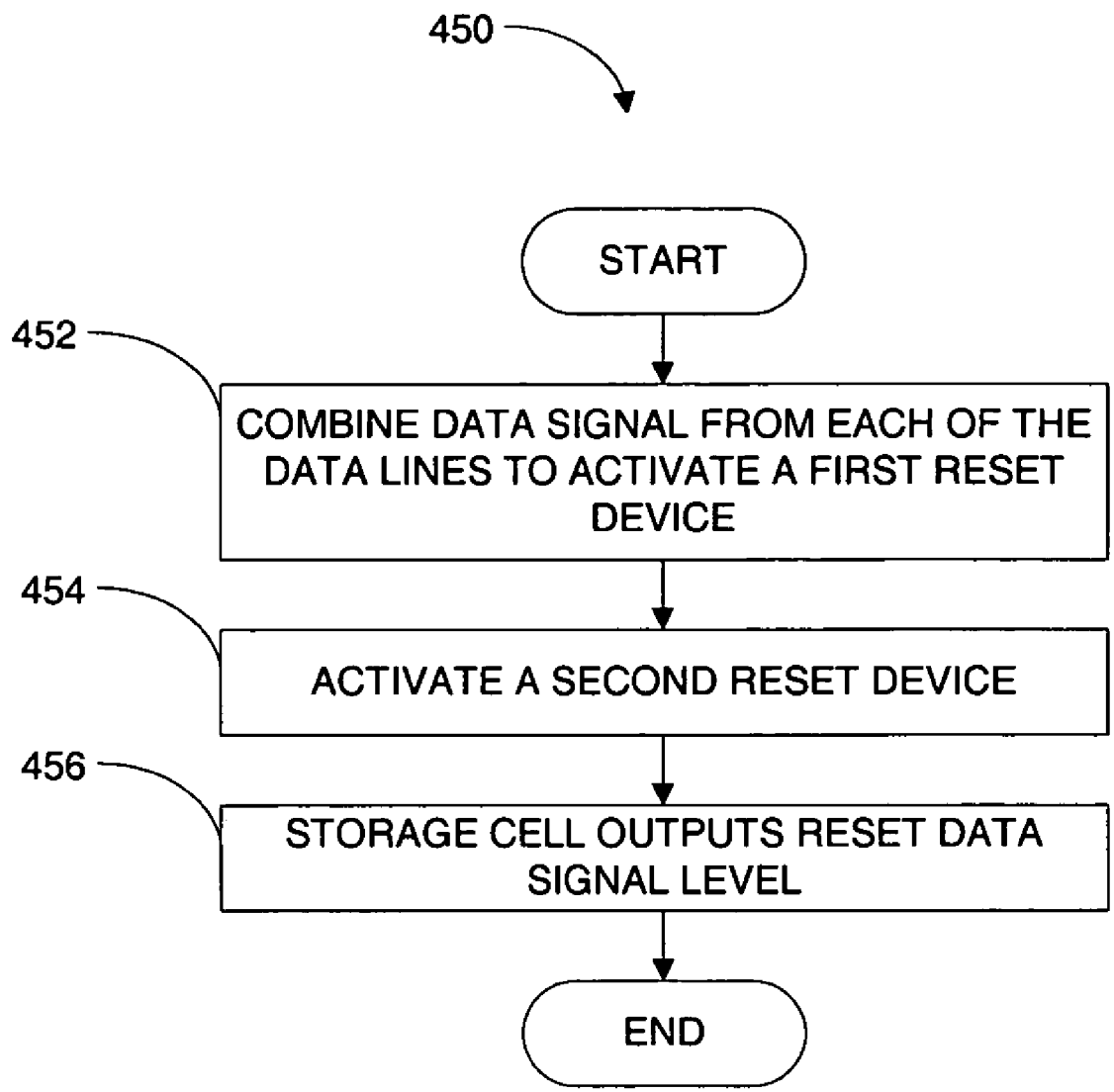
FIG. 4B is a flowchart diagram that illustrates the method operations of resetting a jam latch circuit, in accordance with one embodiment of the present invention.

FIG. 4B is a flowchart diagram 450 that illustrates the method operations of resetting a jam latch circuit, in accordance with one embodiment of the present invention. In an operation 452, resetting the storage cell includes combining the respective data signal from each of the data lines so as to activate (e.g., bias) a first reset device. The first reset device can be a first transistor circuit. The first transistor circuit can be coupled to a reset voltage source. The reset voltage is conducted across the first reset device when the first reset device is activated. The first reset device is coupled in series with a second reset device.

In an operation 454, the second reset device is activated so as to conduct the reset voltage across the second reset device to the storage cell. The second reset device can be activated by a timing signal such as a clock signal, in inverted clock signal or another timing signal. The activation time of the first reset device and the second reset device can be different. In one embodiment, the first reset device is activated after the second reset device. The first reset device can be activated after the second reset device due to variation in respective switching speeds of the first reset device and the second reset device.

In an operation 456, the storage cell is reset and the method operations end. Resetting the storage cell can also include disconnecting a voltage source from the storage cell. In one embodiment, the storage cell can be disconnected from the voltage source when the first reset device is activated.

Figure 5:
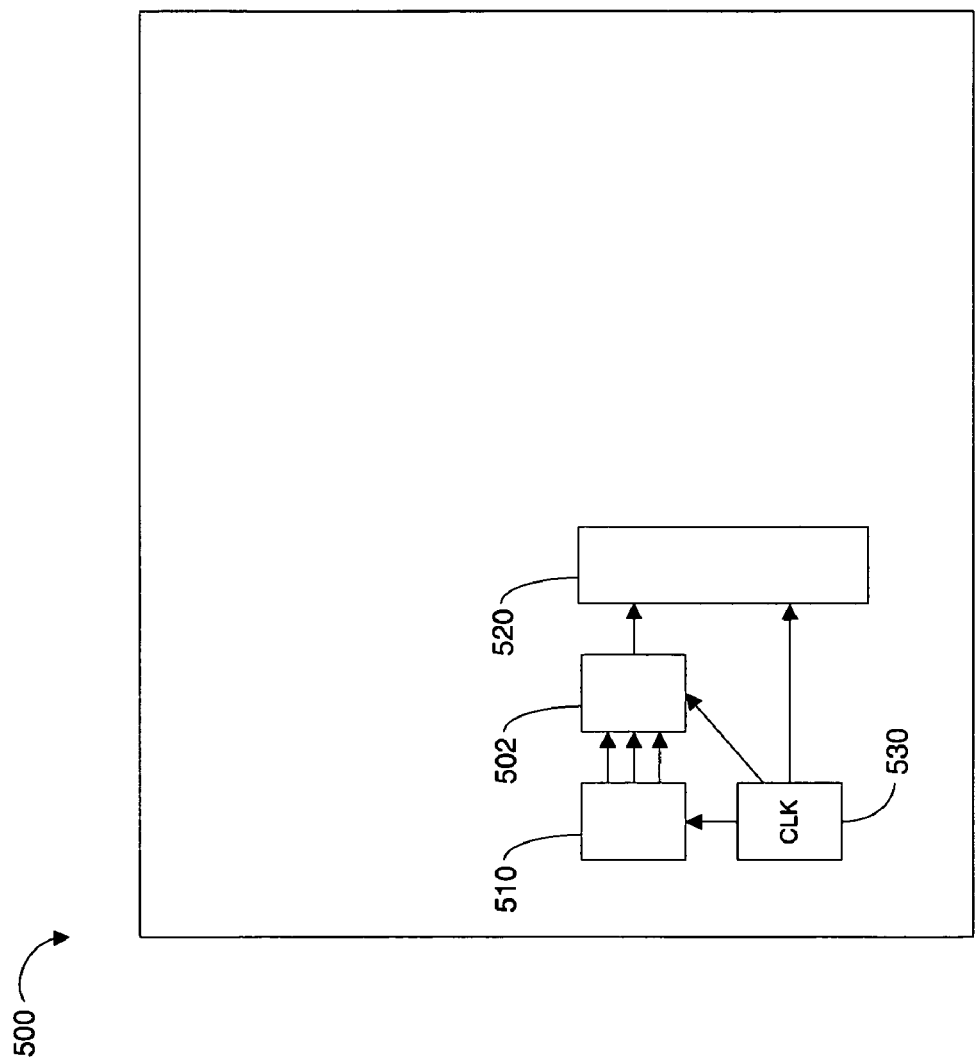
FIG. 5 is a semiconductor die, in accordance with one embodiment of the present invention.

FIG. 5 is a semiconductor die 500, in accordance with one embodiment of the present invention. The semiconductor die 500 includes a jam latch circuit 502 such as a two or more data line jam latch circuits 200 and 300 described above. The jam latch circuit 502 is coupled to the output of a first logic circuit 510 and captures data output from the first logic circuit. An output of the jam latch circuit 502 is coupled to a second logic circuit 520 that uses the data output from the jam latch circuit. A clock signal 530 is also coupled to the jam latch circuit 502, the first logic circuit 510 and the second logic circuit 520.

As used herein in connection with the description of the invention, the term "about" means +/−10%. By way of example, the phrase "about 250" indicates a range of between 225 and 275. It will be further appreciated that the operations represented by the operations in FIGS. 4A and 4B are not required to be performed in the order illustrated, and that all the processing represented by the operations may not be necessary to practice the invention. Further, the processes described in FIGS. 4A and 4B can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of resetting a jam latch comprising:
    combining a respective data signal from each of a plurality of data in signal lines in an activation device, the activation device having an output coupled to a first reset device;
    activating a second reset device with a control signal;
    applying a reset voltage to a storage cell including coupling the reset voltage across the activated first reset device and across the activated second reset device;
    outputting a voltage from a voltage source controller, the voltage source controller includes a control input coupled to the output of the activation device, the voltage source controller further includes a voltage input coupled to a voltage source; and
    applying the voltage to the output of the storage cell.

2. The method of claim 1, wherein combining a respective data signal from each of a plurality of data in signal lines in an activation device, the activation device having an output coupled to a first reset device includes:
    coupling the respective data in signal from each of the plurality of data in signal lines to an activation device; and
    outputting an activation signal, from the activation device to the first reset device, when a level of the respective data in signal from each of the plurality of data in signal lines is substantially equal.

3. The method of claim 1, wherein the control signal includes a clock signal.

4. The method of claim 1, wherein the control signal is inverted.

5. The method of claim 1, further comprising disconnecting the voltage source from the storage cell.

6. The method of claim 5, wherein the voltage source is disconnected from the storage cell substantially simultaneously with activating the first reset device.

7. The method of claim 1, wherein the plurality of data in signal lines includes two or more data in signal lines.

8. A jam latch reset circuit comprising:
    an activation device having respective inputs coupled to each one of a plurality of data in signal lines;
    a first reset device having a first control input coupled to an output of the activation device, the first reset device having a reset voltage source coupled to an input of the first reset device;
    a second reset device having a second control input coupled a control signal, the second reset device being coupled in series with the first reset device;
    a storage cell coupled to an output of the second reset device, the storage cell having an input and an output, the second reset device having an output coupled to the storage cell output, and the storage cell input coupled to an input transistor; and
    a voltage source coupled to the output of the storage cell through a voltage source controller, the voltage source controller includes a control input coupled to the output of the activation device.

9. The circuit of claim 8, wherein the output of the storage cell is coupled to the output of the second reset device.

10. The circuit of claim 8, wherein the control signal is a timing signal.

11. The circuit of claim 8, wherein the activation device is a logic device.

12. The circuit of claim 8, wherein the activation device is a nand gate.

13. The circuit of claim 8, wherein each of the voltage source controller, the first reset device, and the second reset device include transistors.

14. The circuit of claim 8, wherein the plurality of data in signal lines includes two or more data in signal lines.

15. The circuit of claim 8, wherein the storage cell includes a cross coupled inverter pair, the storage cell input being on an opposite side of the cross coupled inverter pair from the storage cell output.

16. A method of capturing data in a jam latch circuit comprising:
   receiving a respective data in signal on at least one of a plurality of data in signal lines;
   charging a storage cell on storage cell input;
   outputting a data signal from a storage cell output;
   combining the respective data in signal from each of the plurality of data in signal lines and the data signal from the storage cell output;
   outputting a jam latch output data signal; and
   resetting a jam latch circuit including:
      combining the respective data in signal from each of the plurality of data in signal lines in an activation device, the activation device having an output coupled to a first reset device;
      activating a second reset device with a control signal;
      applying a reset voltage to the storage cell including coupling the reset voltage across the activated first reset device and across the activated second reset device;
      outputting a voltage from a voltage source controller, the voltage source controller includes a control input coupled to the output of the activation device, the voltage source controller further includes a voltage input coupled to a voltage source; and
      applying the voltage to the output of the storage cell.

17. The method of claim 16, wherein combining the respective data signal from each of the plurality of data in signal lines in an activation device, the activation device having an output coupled to the first reset device includes:
   coupling the respective data in signal from each of the plurality of data in signal lines to an activation device; and
   outputting an activation signal, from the activation device to the first reset device, when a level of the respective data in signal from each of the plurality of data in signal lines is substantially equal.

* * * * *